United States Patent
Kocaman

(10) Patent No.: US 7,560,986 B2
(45) Date of Patent: Jul. 14, 2009

(54) VARIABLE GAIN AMPLIFIER AND METHOD FOR ACHIEVING VARIABLE GAIN AMPLIFICATION WITH HIGH BANDWIDTH AND LINEARITY

(75) Inventor: Namik Kocaman, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/731,481

(22) Filed: Mar. 30, 2007

(65) Prior Publication Data

US 2008/0238542 A1   Oct. 2, 2008

Related U.S. Application Data

(60) Provisional application No. 60/840,123, filed on Aug. 25, 2006.

(51) Int. Cl.
*H03F 3/45* (2006.01)
(52) U.S. Cl. ........................ 330/254; 330/284
(58) Field of Classification Search .............. 330/253, 330/254, 278, 284
See application file for complete search history.

(56) References Cited

U.S. PATENT DOCUMENTS

| | | | | |
|---|---|---|---|---|
| 5,684,431 | A * | 11/1997 | Gilbert et al. | ............ 330/284 |
| 5,870,042 | A | 2/1999 | Noda | |
| 6,177,899 | B1 | 1/2001 | Hsu | |
| 6,204,784 | B1 | 3/2001 | Hatfield | |
| 6,466,629 | B1 | 10/2002 | Isaksson et al. | |
| 6,522,282 | B1 | 2/2003 | Elbornsson | |
| 6,570,410 | B2 | 5/2003 | Manganaro | |
| 6,603,415 | B1 | 8/2003 | Somayajula | |
| 6,653,966 | B1 | 11/2003 | van der Goes et al. | |
| 6,707,868 | B1 | 3/2004 | Camagna, Jr. et al. | |
| 6,982,664 | B1 | 1/2006 | Nairn | |
| 7,027,503 | B2 | 4/2006 | Smee et al. | |
| 7,053,804 | B1 | 5/2006 | Nairn | |
| 7,148,828 | B2 | 12/2006 | Fernandez et al. | |
| 7,233,270 | B2 | 6/2007 | Lin | |
| 7,260,377 | B2 | 8/2007 | Burns et al. | |
| 7,292,101 | B2 * | 11/2007 | Kocaman et al. | ............ 330/254 |
| 7,324,038 | B2 | 1/2008 | van der Goes et al. | |

(Continued)

FOREIGN PATENT DOCUMENTS

EP          1006697 A2      7/2000

(Continued)

OTHER PUBLICATIONS

Stojanovic, Vladimir et al., "Adaptive Equalizer and Data Recovery in a Dual-Mode (PAM2/4) Serial Link Transceiver", Rambus, Inc., Los Altos CA 94022, USA; Department of Electrical Engineering, Stanford University, CA 94305, USA, (2004), pp. 1-4.

(Continued)

*Primary Examiner*—Khanh V Nguyen
(74) *Attorney, Agent, or Firm*—Brake Hughes Bellermann, LLP

(57) ABSTRACT

A fine granularity, wide-range variable gain amplifier ("VGA") comprises an attenuator, a high gain signal path, a low gain signal path and a gain adjustment control to adjust a gain of the VGA, wherein the gain adjustment control is configured to cause a selective activation of at least a portion of the low gain signal path or the high gain signal path to achieve a desired overall gain.

18 Claims, 7 Drawing Sheets

U.S. PATENT DOCUMENTS

| | | | |
|---|---|---|---|
| 7,355,476 B2 * | 4/2008 | Kasha et al. | ............ 330/284 |
| 2002/0164966 A1 | 11/2002 | Meehan et al. | |
| 2003/0174783 A1 | 9/2003 | Rahman et al. | |
| 2005/0270212 A1 | 12/2005 | Smith et al. | |
| 2006/0067699 A1 | 3/2006 | Chandrasekhar et al. | |
| 2007/0024484 A1 | 2/2007 | Liu | |
| 2007/0133719 A1 | 6/2007 | Agazzi et al. | |
| 2008/0048896 A1 | 2/2008 | Parthasarthy et al. | |
| 2008/0048897 A1 | 2/2008 | Parthasarthy et al. | |
| 2008/0049825 A1 | 2/2008 | Chen et al. | |
| 2008/0049847 A1 | 2/2008 | Telang et al. | |
| 2008/0069198 A1 | 3/2008 | Bhoja et al. | |
| 2008/0069199 A1 | 3/2008 | Chen et al. | |
| 2008/0187082 A1 | 8/2008 | Bhoja et al. | |
| 2008/0240325 A1 | 10/2008 | Agazzi et al. | |
| 2008/0258814 A1 | 10/2008 | Kocaman et al. | |
| 2008/0272952 A1 | 11/2008 | Wood | |

FOREIGN PATENT DOCUMENTS

| | | | |
|---|---|---|---|
| WO | 0213424 | A2 | 2/2002 |
| WO | 02071616 | A2 | 9/2002 |

OTHER PUBLICATIONS

Koc, UT-VA "Adaptive Electronic Dispersion Compensator for Chromatic and Polarization-Mode Dispersions in Optical Communications Systems", Bell Labs, Lucent Technologies, USA, Apr. 1, 2004; Eurasip Journal on Applied Signal Processing 2005:10, 1584-1592; 2005 Hindlaw Publishing Corporation, (2005).

Nikolic, Borivoje "Advanced Topics in Circuit Design: High-Speed Electrical Interfaces", EE209C-Spring 2004; Lecture 16: Components, Decision Feedback Equalizers, (Mar. 11, 2004), pp. 1-19.

Mueller, Kurt H., "Timing Recovery in Digital Synchronous Data Receivers", IEEE Transactions on Communications, vol. Com-24, No. 5, (May 1976), pp. 516-531.

Notice of Allowance from U.S. Appl. No. 11/845,765. dated Oct. 10, 2008.

European Search report from U.S. Appl. No. 11/837,301 dated Dec. 6, 2007.

European Search report from U.S. Appl. No. 11/837,278 dated Dec. 6, 2007.

Notice of Allowance from U.S. Appl. No. 11/845,762, mailed Aug. 11, 2008.

Notice of Allowance for U.S. Appl. No. 11/845,762, mailed Dec. 3. 2008, and received on Dec. 8, 2008.

Notice of Allowance for U.S. Appl. No. 11/845,765, mailed Dec. 18. 2008.

Non-final Office Action for U.S. Appl. No. 12/135,720, mailed on Mar. 19, 2009.

* cited by examiner

VARIABLE GAIN AMPLIFIER AND METHOD FOR ACHIEVING VARIABLE GAIN AMPLIFICATION WITH HIGH BANDWIDTH AND LINEARITY

CROSS-REFERENCE TO RELATED APPLICATION

This application claims priority under 35 U.S.C. §119(e) to Provisional Patent Application 60/840,123, filed Aug. 25, 2006, and titled "Digital Electronic Dispersion Compensation for Multi-Mode Fiber."

TECHNICAL FIELD

This description relates to analog circuits. In particular, this description relates to an amplifier and associated circuit topology for achieving variable gain amplification with high bandwidth and fine granularity promoting high linearity.

BACKGROUND

In many applications it may be necessary to amplify an analog signal exhibiting a wide amplitude range. For example, a wide range of input signals may be present at the receiving end of a multi-mode fiber optic cable. Such a signal may require analog conditioning or digital signal processing to correct for degradation introduced by the physical medium of transmission, i.e., the optical cable itself.

In many signal conditioning systems especially communication links, in order to compensate for a wide amplitude range of received information bearing signals, the input signals are subjected to amplitude adjustment using a VGA ("Variable Gain Amplifier"). A VGA allows for the selection and adjustment of gain to be applied to an input signal. Amplitude adjustment or so called gain adjustment of an incoming signal by a VGA is used to achieve an amplitude level well above the noise and offset thresholds. Without the application of gain adjustment, it may not be feasible to perform further post processing of an incoming signal, such as adaptive equalization.

Cascading gain stages may provide a wide range of amplification and/or attenuation. However, each additional stage may be undesirable as it will introduce harmonic distortion. Harmonic distortion typically arises due to non-linearities inherent in each stage.

Thus, it is desirable to devise an amplitude adjustment scheme using a VGA with a low number of gain stages such that the VGA is suitable for high bandwidth and high linearity applications with a wide amplitude adjustment range.

SUMMARY

According to one general aspect, a high bandwidth, a fine granularity variable gain amplifier ("VGA") is described comprising a gain block, the gain block comprising at least one input node, a low gain output tap and a high gain output tap, a parallel gain block, wherein the parallel gain block comprises a low gain signal path and a high gain path, the low gain signal path and the high gain signal path respectively coupled to the low gain output tap and the high gain output tap of the attenuator, a cascaded gain block, wherein the low gain signal path and the high gain signal path are coupled to an input of the cascaded gain block, and a gain adjustment control to adjust a gain of the VGA, wherein the gain adjustment control is configured to cause a selective activation of at least a portion of the low gain path or the high gain path in the parallel gain path to achieve a desired overall gain.

According to another general aspect, a method for providing variable gain amplification of an input signal with high bandwidth and high linearity is described comprising configuring a low gain signal path and a high gain signal path, receiving an input signal, passively generating a first attenuated signal and a second attenuated signal from the input signal, the first attenuated signal having a larger attenuation than the second attenuated signal, generating a low gain amplified signal from the first attenuated signal and a high gain amplified signal from the second attenuated signal via respectively the low gain signal path and the high gain signal path, generating a composite signal by combining the low gain signal and the high gain signal, and amplifying the composite signal to generate a VGA output signal.

The details of one or more implementations are set forth in the accompanying drawings and the description below. Other features will be apparent from the description and drawings, and from the claims.

DETAILED DESCRIPTION

Figure 1:
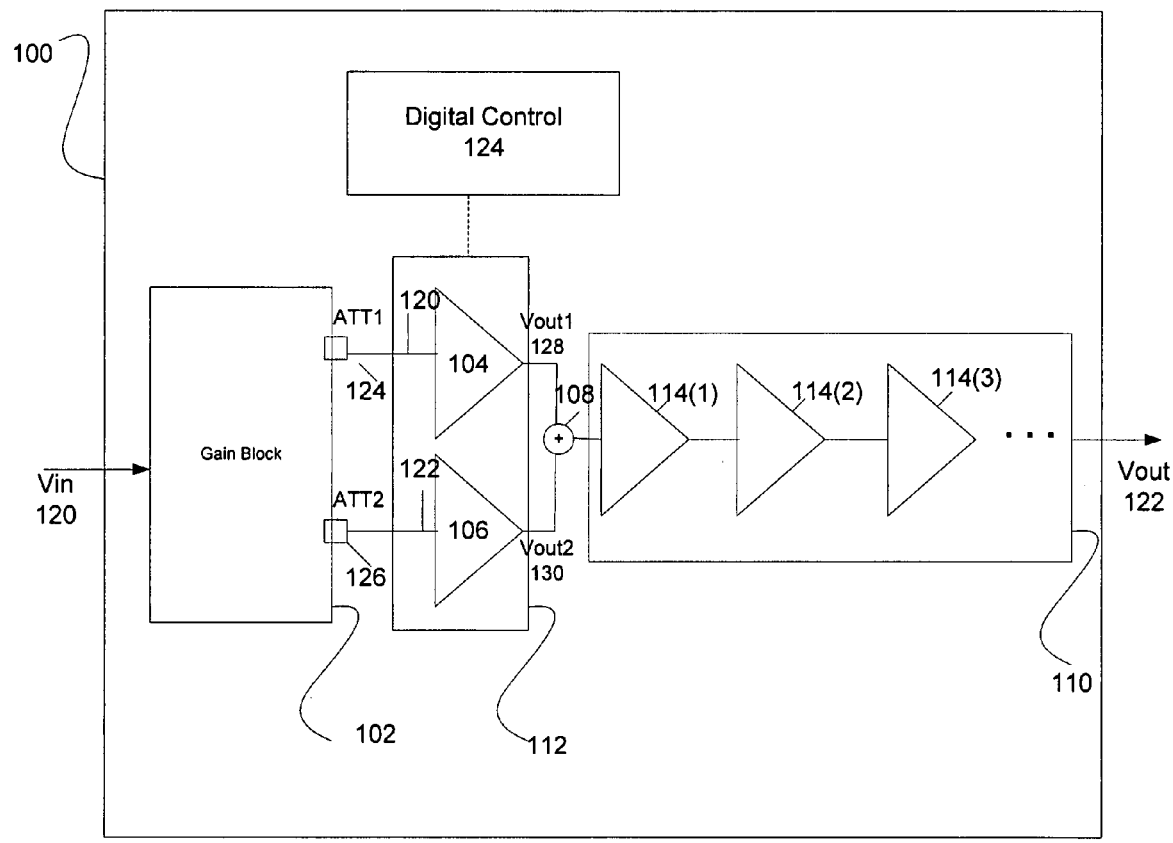
FIG. 1 is a block diagram of a VGA for achieving a high gain output signal from a received input signal with high bandwidth and linearity.

FIG. 1 is a block diagram of a VGA topology 100 for achieving a high gain output signal 122 having substantially high bandwidth and linearity from a received input signal 120. The VGA topology may receive an input signal 120 which is passed to a gain block 102, a parallel gain block 112, and a cascade gain block 110 to produce a VGA output signal 122. Although FIG. 1 depicts single-ended signals, it will be understood by skilled practitioners that the topology shown in FIG. 1 may be utilized with differential signals.

The gain block 102 may compensate for a wide range of input signal 120 amplitudes. The gain block 102 may provide gain greater than unity, in which case it may function as an amplifier. Alternatively, the gain block 102 may provide gain less than unity in which case it may function as an attenuator.

According to one embodiment, the gain block 102 may be an attenuator that comprises passive components to achieve attenuation of the input signal with high bandwidth. For example, the gain block 102 may comprise a resistive ladder, including a plurality of resistors (described below with reference to FIG. 3). The gain block 102 may comprise a plurality of output taps (e.g., 124, 126) that provide output signals at various attenuation amplitudes. For example, output tap 124 may provide a high gain output (ATT1) feeding high gain signal path 120 while output tap 126 may provide a low gain output (ATT2) feeding low gain signal path 122.

The parallel gain block 112 may include a plurality of parallel gain stages 104, 106. Although only two parallel gain stages 104, 106 are shown in FIG. 1, it will be understood by skilled practitioners that the parallel gain block may include an arbitrary number of parallel gain stages (e.g., 104, 106). As described below, the parallel gain stages 104, 106 may each respectively comprise a plurality of gm cells (not shown in FIG. 1 but described below). Gm refers to a transconductance of a simple amplification circuit in which a voltage signal is received at an input to generate a current signal at an output. Both parallel gain stages 104, 106 may be identical comprising identical gm stages with identical current densities and to minimize phase delay between the respective outputs of the gain stages 104, 106.

The parallel gain stages 104, 106 in parallel gain block 112 may respectively be placed in the high gain signal path 120 and the low gain signal path 122. In particular, the high gain signal path 120 may be coupled to the high gain output tap 124 of gain block 102 while the low gain signal path 122 may be coupled to the low gain output tap 126 of the gain block 102. As described below, depending upon the particular combination of gm stages comprising each of the parallel gain stages 104, 106 that may be selectively activated, various amplification levels may be achieved at summing block 108. The number of combinations of gm stages that may be activated may directly provide fine granular control of the amplification level (e.g., each combination may provide a varying level of gain adjustment). A digital control block 124 may be utilized to control the activation of gm stages within parallel gain block 112. One particular example of a process for selecting a gain for a VGA is illustrated below with respect to FIG. 7.

The outputs of the parallel gain block 112 (e.g., parallel gain stages 104, 106) may be summed at a summing block 108 to provide an input to a cascade gain block 110. Although FIG. 1 shows only two summed gain stages (104, 106), it will be understood by skilled practitioners that any arbitrary number of parallel gain stages comprising a parallel gain block 112 may be summed at the summing block 108.

The summed output signals from the parallel gain block 112 may be received by a cascade gain block 110 where the summed signal is amplified by one or more cascaded gain stages (e.g., 114(1), 114(2), 114(3)). Although the cascade gain block 110 shown in FIG. 1 shows three cascaded gain stages 114(1), 114(2) and 114(3), it will be understood by skilled practitioners that the cascade gain block 110 may include any number of cascaded gain stages. The output signal 122 of the cascade gain block 110 may then further processed. Inductive peaking may be utilized at the output of every gain stage in order to reduce phase delay problems and increase bandwidth.

Figure 2:
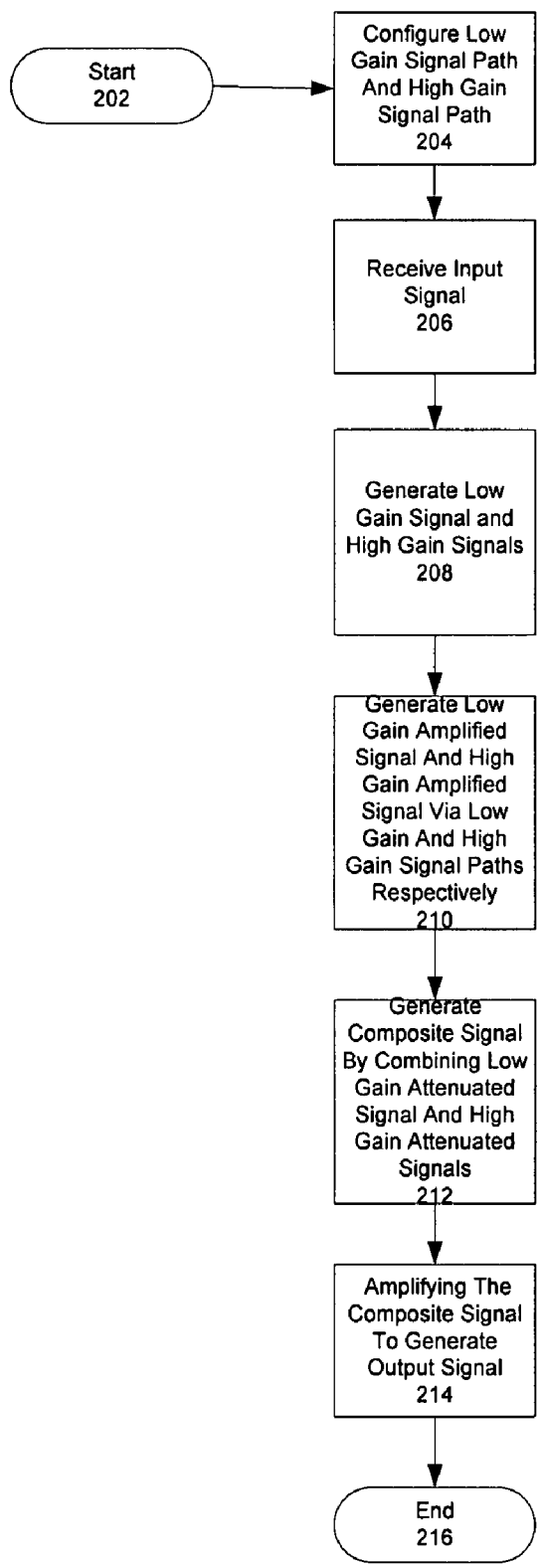
FIG. 2 is a flowchart illustrating example operations of the VGA topology of FIG. 1.

FIG. 2 is a flowchart illustrating example operations of the VGA topology of FIG. 1. The process is initiated (202). A low gain signal path and a high gain signal path may be configured (204). As described with respect to FIG. 1, the low gain signal path and high gain signal path may each respectively comprise a separate gain stage further, each gain stage further comprising a plurality of amplification elements. Each of the amplification elements may be selectively activated or deactivated via the digital control block 124. An input signal that is to be amplified may be received (206). A low gain attenuated signal and a high gain attenuated signal may be respectively generated (208). The generation of the low and high gain attenuated signals may be achieved via the gain block 102. A low gain amplified signal and a high gain amplified signal may be respectively generated from the low gain attenuated signal and the high gain attenuated signal via the low gain signal path and the high gain signal path (210). A composite signal may be generated by combining the low gain amplified signal and the high gain amplified signal (212). This combination may be achieved, for example, by summing the low gain amplified signal and the high gain amplified signal at a common node. The composite signal may then be further amplified to generate a VGA output signal (214). This further amplification may be achieved in a cascaded fashion. VGA amplification may now be completed (216).

Figure 3:
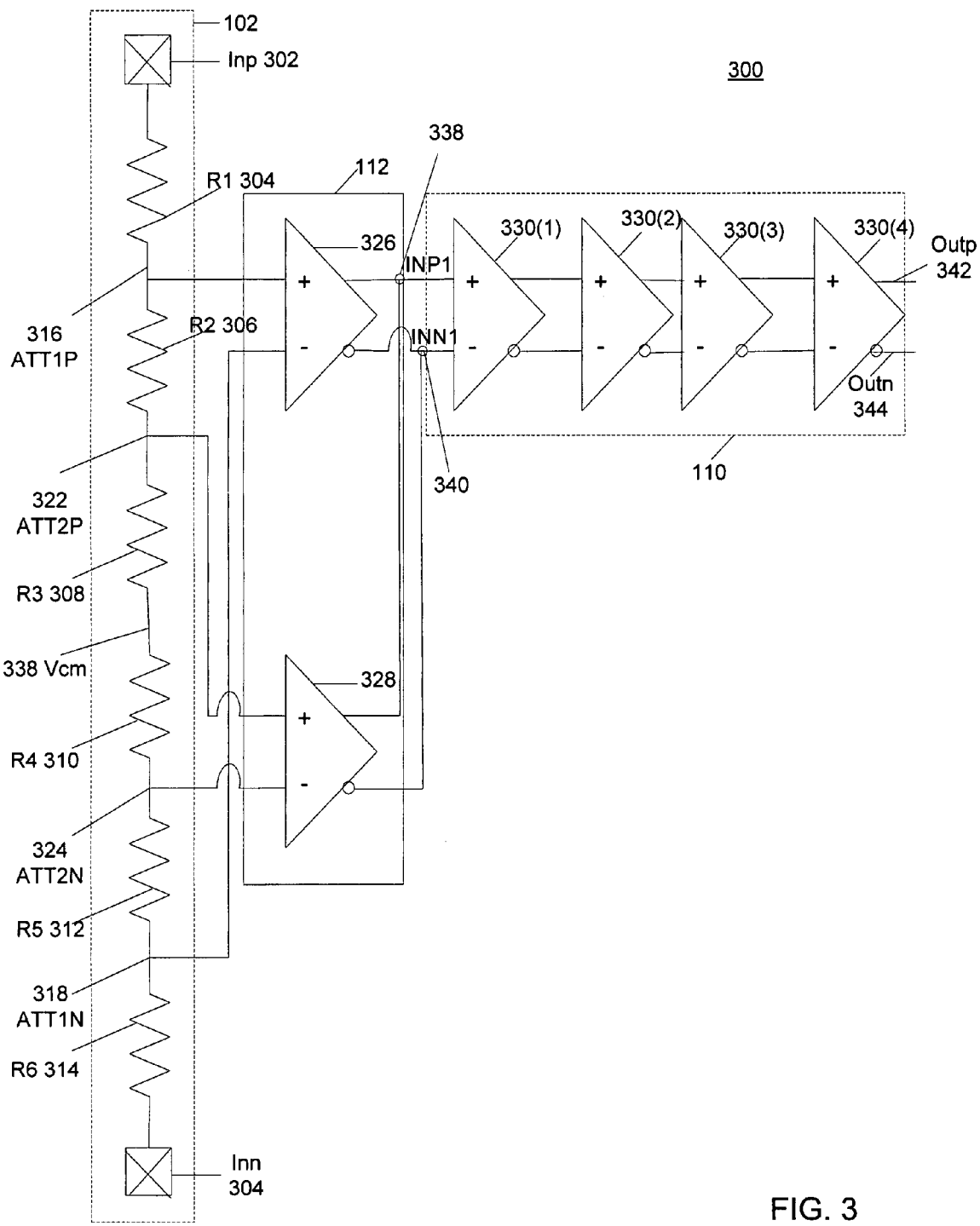
FIG. 3 is a schematic of a VGA with high bandwidth and high linearity that incorporates differential signaling.

FIG. 3 is a schematic of a VGA amplifier 300 with high bandwidth and high linearity that incorporates differential signaling. FIG. 3 provides a specific example of the topology shown in FIG. 1. The VGA may include a gain block 102, a parallel gain block 112 and a cascade gain block 110. A differential signal (not shown in FIG. 3) may be received via differential inputs Inp 302 and Inn 304 at gain block 102. The gain block 102 may be an attenuator that comprises a resistive ladder having a plurality of resistors (e.g., R1 304, R2 306, R3 308, R4 310, R5 312 and R6 314).

The gain block 102 may provide various output taps for generating differential output signals having various levels of attenuation. For example, the gain block 102 may generate high gain differential signals (ATT1P 316, ATT1N 318) and low gain differential signals (ATT2P 322, ATT2N 324). Thus, the gain block 102 may include output taps 316 generating signal ATT1P, output tap 318 generating signal ATT1N, output tap 322 generating signal ATT2P and output tap 324 generating signal ATT2N. In the case where the gain block 102 is an attenuator using passive components, the various amplitude output signals from the gain block 102 may be generated via the technique of a voltage divider using a resistive ladder as shown in FIG. 3. The ATT1N and ATT2N signals shown in FIG. 3 may correspond to the following amplitudes:

$$ATT1P = \frac{R2 + R3}{R1 + R2 + R3}(Inp - Vcm)$$

$$ATT2P = \frac{R3}{R1 + R2 + R3}(Inp - Vcm)$$

Similarly the ATT2N and ATT2P signals shown in FIG. 3 may correspond to the following amplitudes:

$$ATT1N = \frac{R2 + R3}{R1 + R2 + R3}(Inn - Vcm)$$

$$ATT2N = \frac{R3}{R1 + R2 + R3}(Inn - Vcm)$$

High gain differential signal (ATT1P, ATT1N) and low gain differential signal (ATT2P, ATT2N) may be respectively provided to parallel block 112. In particular, as shown in FIG. 3 the high gain differential signal (ATT1P, ATT1N) may be provided to a first differential parallel gain stage 326 while low gain differential signal (ATT2P, ATT2N) may be provided to a second differential parallel gain stage 328. Each of the differential parallel gain stages (326, 328) may provide amplification of their respective input signals. According to one embodiment, parallel gain stages 326 and 328 may be identical providing identical amplitude gain and phase delay. It is also possible to achieve a unity gain by omitting resistor R1.

The differential outputs of the parallel gain block 112 may be provided to a cascade gain stage 110 where they are summed at respective common differential node inputs (338, 340). The differential signal provided to cascade gain block 110 may then be amplified by any number of cascaded gain stages (e.g., 330(1), 330(2), 330(3), 330(4)) to generate differential outputs 342 and 344. Although FIG. 3 shows only four cascaded gain stages, it will be understood that cascade gain stage 110 may include any arbitrary number of cascaded gain stages.

Figure 4:
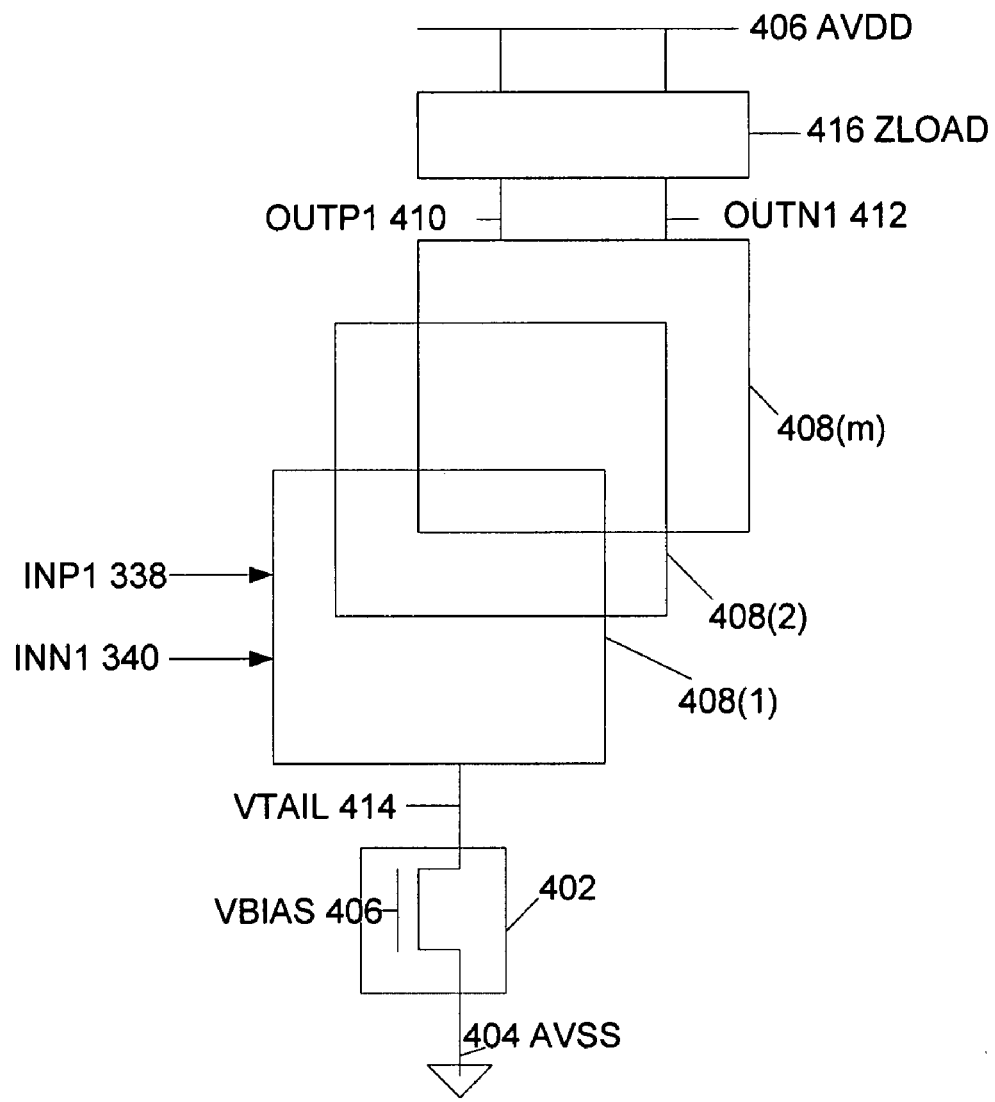
FIG. 4 is schematic of a cascaded gain stage.

FIG. 4 is schematic of a cascaded gain stage 110. Any number of cascaded gain stages 330 may be included in a cascade gain block 110. Each cascaded gain stage 330 may include any number of gm elements 408(1)-408(m) (described below with reference to FIG. 6), which in aggregate operation achieve a gain for the cascaded gain stage 330. In particular, each gm element 408(1)-408(m) may be selectively activated or deactivated to adjust an overall gain for the cascaded gain stage 330. Each of the gm elements may be viewed as a separate amplification element for the stage. Each of the gm elements 408(1)-408(m) may be a differential pair arranged in a common source configuration as described below with reference to FIG. 6.

The gm elements 408(1)-408(m) may all respectively be coupled at their source nodes to a tail transistor 402 that may operate as a current source. Further, the gm elements 408(1)-408(m) may all respectively be coupled to a load block ZLOAD 416, which may comprise either a passive load such as a resistor or an active load possibly generated using one or more MOSFET transistors.

A voltage source AVDD 406 may be coupled to the load block ZLOAD 416, to provide a voltage bias. The source of the tail transistor 404 may be coupled to a common voltage reference AVSS 404. Differential input signal INP1 338 and INN1 340 may be provided as input to each of the gm elements 408(1)-408(m). The input differential signal INP1 338 and INN1 340 may be amplified by each of the gm elements 408(1)-408(m) to generate a composite amplified differential signal OUTP1 410 and OUPTN1 412.

Figure 5:
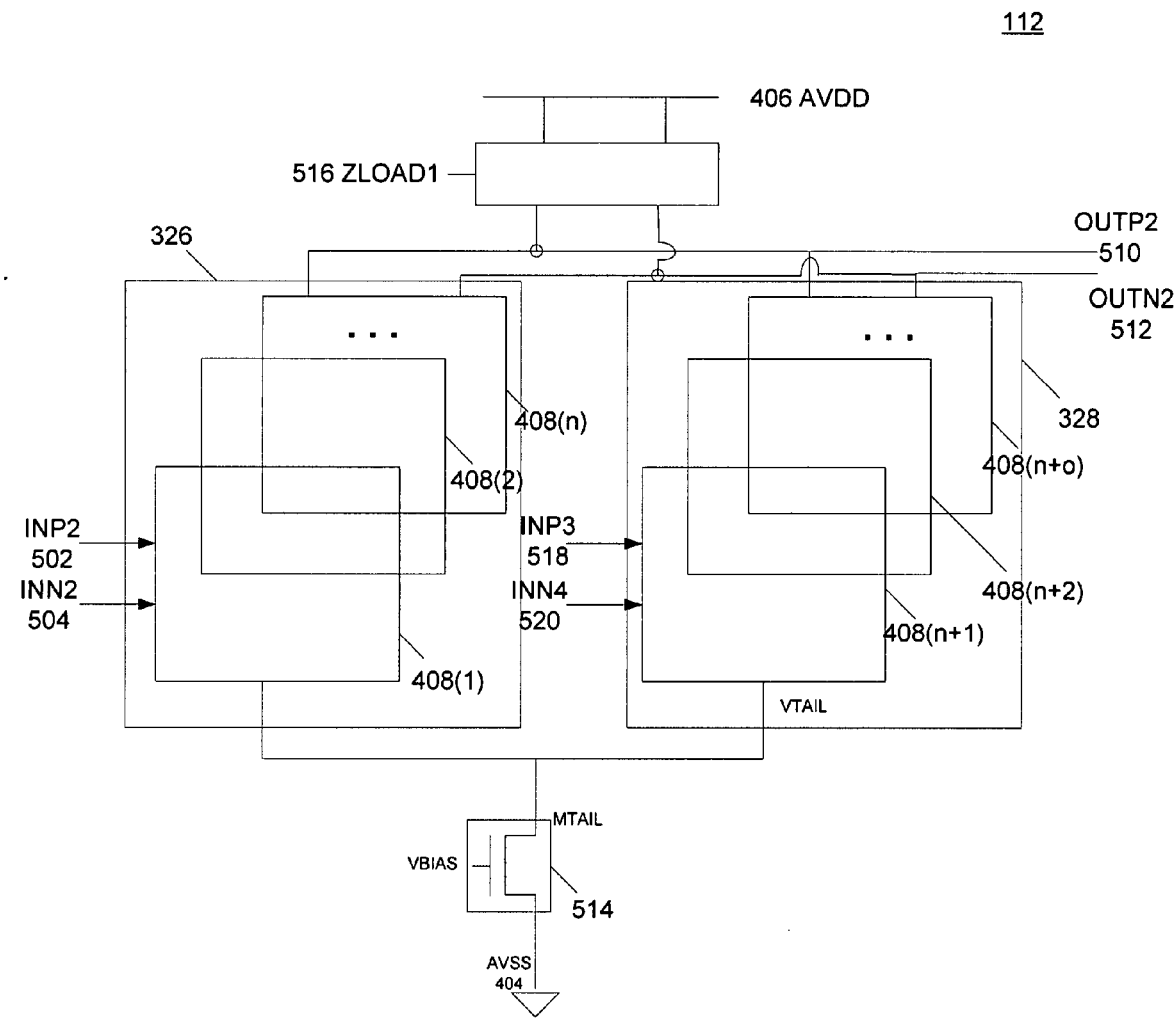
FIG. 5 is a schematic of a parallel gain block.

FIG. 5 is a schematic of a parallel gain block 112. The parallel gain block 112 may include a first differential parallel gain stage 326 and a second differential parallel gain stage 328. Each parallel gain stage 326, 328 may include any number of gm elements (respectively 408(1)-408(n) and 408(n+1)-408(n+o)) (described below with reference to FIG. 6), which in aggregate operation achieve a gain for each of the parallel gain stages 326 and 328 in the parallel gain block 112. In particular, each gm element 408(1)-408(n) and 408(n+1)-408(n+o) may be selectively activated or deactivated to adjust an overall gain for their respective gain stages 326, 328. Each of the gm elements 408(1)-408(n) and 408(n+1)-408(n+o) may be a differential pair arranged in a common source configuration as described below with reference to FIG. 6.

The gm elements 408(1)-408(n), 408(n+1)-408(n+o) may all respectively be coupled to a tail transistor 514 that may operate as a current source. Further, the gm elements 408(1)-408(n), 408(n+1)-408(n+o) may all respectively be coupled to a load block ZLOAD 516, which may comprise either a passive load such as a resistor or an active load possibly generated using one or more MOSFET transistors.

A voltage source AVDD 406 may be coupled to the load block ZLOAD 516, to provide a voltage bias. The source of the tail transistor 514 may be coupled to a common voltage reference AVSS 404. Differential input signal INP2 502, INN2 504 may be provided as input to the first parallel gain stage 326, while differential input signal INP3 518, INN3 520 may be provided as an input to the second differential parallel gain stage 328. Each of the differential signals (INP2 502, INN2 504 and INP3 518, INN3 520) may be amplified by the respective parallel gain stages 326, 328 to generate respective outputs (not shown in FIG. 5), which are combined at a common node to produce a differential output signal OUTP2 510, OUTN2 512.

Figure 6:
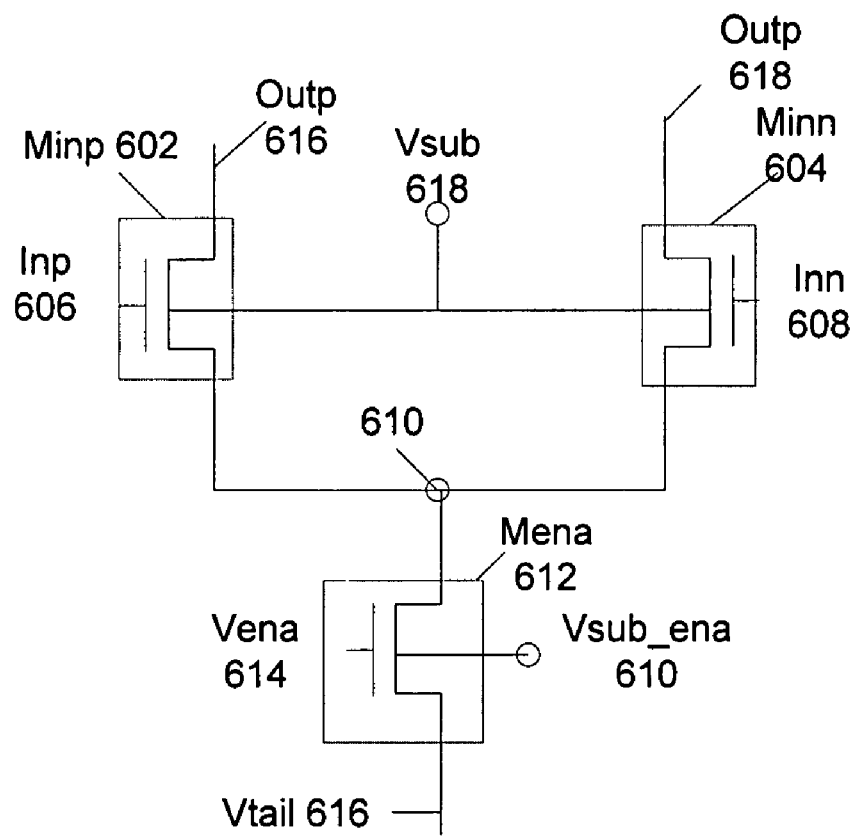
FIG. 6 is a schematic of a differential pair that may be utilized as a gm element in a parallel gain stage or a cascade gain stage.

FIG. 6 is a schematic diagram of a differential pair that may be utilized as a gm element in a parallel gain stage or a cascade gain stage. The differential pair 600 may include a first input transistor 602 and a second input transistor 604 respectively receiving input signals Inp 606 and Inn 608. Although the differential pair 600 shown in FIG. 6 utilizes nmos transistors for input transistors 602, 604, the input transistors 602, 604 may also be pmos transistors. The substrate of each of the input transistors 602, 604 may be coupled to a common substrate node Vsub 606.

Figure 7:
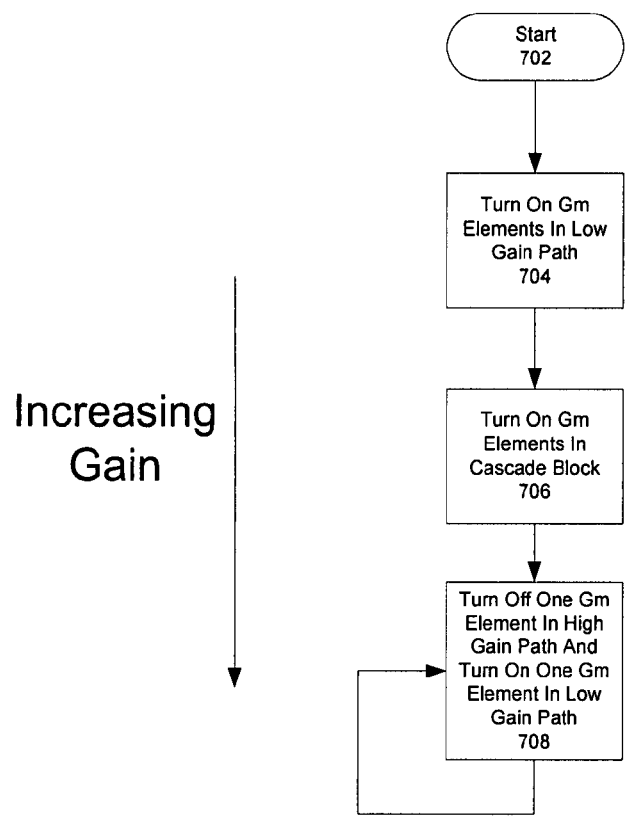
FIG. 7 is a flowchart of a process for selecting a gain for a VGA.

FIG. 7 is a flowchart that illustrates a process for increasing or decreasing the gain achieved with a VGA. The process is initiated in step 702. In step 704, a set of gm elements in the low gain path 122 may be activated. In step 706, the gain may be increased by turning on a set of gm elements in the cascade block 110. In step 708, the gain may be further increased by turning on gm elements in the high gain path 120 while correspondingly turning off the same number of gm elements in the low gain path 122. By turning on and off corresponding numbers of gm elements in the low gain 122 and high gain paths 120 insures maintenance of a fixed common mode. Of course the overall gain for the VGA may be lowered by following the process as shown in FIG. 7 in reverse order.

The source nodes of each of the input transistors 602, 604 may both be coupled together at a common node 610, which is also coupled to a third transistor Mena 612. The third transistor Mena 612 may itself be coupled to a current source, for example a common current source transistor such as Mtail 514 shown in FIG. 5. The differential pair 600 may be selectively activated or deactivated by respectively turning transistor Mena 612 on or off. Gain may be achieved for the differential pair 600 by steering current from the source/drain of transistor Inp 606 and the source/drain of transistor Inn 608. The third transistor Mena 612 may receive bias signal Vena 614, with its substrate node biased by a signal Vsub_ena 610.

The various techniques described herein may be implemented in digital electronic circuitry, or in computer hardware, firmware, software, or in combinations of them. Furthermore, these techniques may also be implemented as a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A high bandwidth, fine granularity variable gain amplifier ("VGA") comprising:
    a gain block, the gain block comprising at least one input node, a low gain output tap and a high gain output tap;
    a parallel gain block, wherein the parallel gain block comprises a low gain signal path and a high gain signal path, the low gain signal path and the high gain signal path respectively coupled to the low gain output tap and the high gain output tap of the gain block;
    a gain adjustment control to adjust a gain of the VGA, wherein the gain adjustment control is configured to cause a selective activation of at least a portion of the low gain path or the high gain path in the parallel gain path to achieve a desired overall gain; and
    a cascaded gain block, wherein the low gain signal path and the high gain signal path are coupled to an input of the cascaded gain block.

2. The VGA of claim 1, wherein the high gain signal path and the low gain signal path respectively comprise a first amplifier stage and a second amplifier stage.

3. The VGA of claim 2, wherein the first gain amplifier stage and the second gain amplifier stage each comprise a plurality of differential pairs.

4. The VGA of claim 1, wherein the gain block is an attenuator.

5. The VGA of claim 4, wherein the attenuator comprises a passive network.

6. The VGA of claim 5, wherein the passive network comprises a resistive ladder.

7. The VGA of claim 1, wherein the cascaded gain block includes a plurality of amplifier stages arranged in a cascade configuration.

8. The VGA of claim 3, wherein the gain activation control is configured to at least one of activate and deactivate at least one differential pair in at least one of the first gain amplifier stage and the second gain amplifier stage as a function of the desired overall gain.

9. The VGA of claim 2, wherein the amplifier stages provide differential inputs and outputs.

10. The VGA of claim 2, wherein the amplifier stages provide single ended inputs and outputs.

11. The VGA of claim 3, wherein the gain adjustment control is configured to receive a desired overall gain parameter as input and to provide a digital control signal as output for activating and deactivating the differential pairs.

12. A method for providing variable gain amplification of an input signal with high bandwidth and high linearity comprising:
    configuring a low gain signal path and a high gain signal path;
    receiving an input signal;
    passively generating a first attenuated signal and a second attenuated signal from the input signal, the first attenuated signal having a larger attenuation than the second attenuated signal;
    generating a low gain amplified signal from the first attenuated signal and a high gain amplified signal from the second attenuated signal via respectively the low gain signal path and the high gain signal path;
    generating a composite signal by combining the low gain signal and the high gain signal; and
    amplifying the composite signal in a cascade manner to generate a VGA output signal.

13. The method of claim 12, wherein passively generating the first and second attenuated signals is achieved by providing the input signal to an input of a resistive ladder and respectively tapping the resistive ladder at a first output node and a second output node, the first output node providing a higher attenuation than the second output node.

14. The method of claim 12, wherein configuring a low gain signal path and a high gain signal path further comprises activating a plurality of amplification elements comprising the low gain signal path and the high gain signal path.

15. The method of claim 12, wherein the VGA output signal is differential.

16. The method of claim 12, wherein the VGA output signal is single ended.

17. The method of claim 14, wherein the activation of at least one amplification element is achieved via a digital control signal.

18. The method of claim 17, wherein the amplification element is a differential pair and the digital control signal causes one of the activation and deactivation of a tail current in a differential amplifier pair.

* * * * *